(12) United States Patent
Che et al.

(10) Patent No.: US 10,928,693 B2
(45) Date of Patent: Feb. 23, 2021

(54) ARRAY SUBSTRATE, REPAIR METHOD OF ARRAY SUBSTRATE, DISPLAY PANEL AND DISPLAY DEVICE

(71) Applicants: Hefei Xinsheng Optoelectronics Technology Co., Ltd., Hefei (CN); BOE Technology Group Co., Ltd., Beijing (CN)

(72) Inventors: Lu Che, Beijing (CN); Qiangqiang Ji, Beijing (CN); Guoquan Liu, Beijing (CN); Qiang Zhou, Beijing (CN); Xiaomei Wei, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 31 days.

(21) Appl. No.: 16/319,972

(22) PCT Filed: Apr. 23, 2018

(86) PCT No.: PCT/CN2018/084099
§ 371 (c)(1),
(2) Date: Jan. 23, 2019

(87) PCT Pub. No.: WO2018/219065
PCT Pub. Date: Dec. 6, 2018

(65) Prior Publication Data
US 2019/0243195 A1 Aug. 8, 2019

(30) Foreign Application Priority Data

May 27, 2017 (CN) .......................... 201710393686.9

(51) Int. Cl.
*G02F 1/1362* (2006.01)
*H01L 21/66* (2006.01)
(Continued)

(52) U.S. Cl.
CPC .... *G02F 1/136259* (2013.01); *G02F 1/13439* (2013.01); *H01L 22/22* (2013.01);
(Continued)

(58) Field of Classification Search
CPC .............................. H01L 22/22; H01L 27/124
See application file for complete search history.

(56) References Cited

U.S. PATENT DOCUMENTS

2005/0094081 A1 5/2005 Lee
2010/0265424 A1* 10/2010 Chiu ................. G02F 1/136259
349/54
2013/0027624 A1 1/2013 Zhuang et al.

FOREIGN PATENT DOCUMENTS

CN 101666948 A 3/2010
CN 102289120 A 12/2011
(Continued)

OTHER PUBLICATIONS

Jul. 20, 2018—(WO) International Search Report and Written Opinion Appn PCT/CN2018/084099 with English Translation.

*Primary Examiner* — Ermias T Woldegeorgis
(74) *Attorney, Agent, or Firm* — Banner & Witcoff, Ltd.

(57) ABSTRACT

An array substrate, a repair method of the array substrate, a display panel and a display device are provided. The array substrate includes a base substrate, and a common electrode layer, a common electrode line mesh, a first metal layer and a second metal layer which are on the base substrate, and the common electrode line mesh is electrically connected with the common electrode layer. The first metal layer includes a first signal line extending along a first direction; the second metal layer includes a second signal line extending along a second direction and a plurality of repair connection portions; and each repair connection portion has a first overlap (Continued)

portion overlapping the first signal line and a second overlap portion overlapping the common electrode line mesh.

20 Claims, 5 Drawing Sheets

(51) Int. Cl.
  *G02F 1/1343* (2006.01)
  *H01L 27/12* (2006.01)
  *G02F 1/1368* (2006.01)
(52) U.S. Cl.
  CPC .......... *H01L 27/124* (2013.01); *G02F 1/1368* (2013.01); *G02F 2001/136263* (2013.01)

(56) References Cited

FOREIGN PATENT DOCUMENTS

| | | |
|---|---|---|
| CN | 102650784 A | 8/2012 |
| CN | 107179640 A | 9/2017 |

* cited by examiner

ARRAY SUBSTRATE, REPAIR METHOD OF ARRAY SUBSTRATE, DISPLAY PANEL AND DISPLAY DEVICE

The application is a U.S. National Phase Entry of International Application No. PCT/CN2018/084099 filed on Apr. 23, 2018, designating the United States of America and claiming priority to Chinese Patent Application No. 201710393686.9 filed on May 27, 2017. The present application claims priority to and the benefit of the above-identified applications and the above-identified applications are incorporated by reference herein in their entirety.

TECHNICAL FIELD

Embodiments of the present disclosure relate to an array substrate, a repair method of the array substrate, a display panel and a display device.

BACKGROUND

Thin film transistor liquid crystal displays (TFT-LCDs) have the advantages of small size, low power consumption, relatively low manufacturing cost and no radiation, and thus have a dominant portion in the current flat panel display market.

SUMMARY

According to embodiments of the present disclosure, an array substrate is provided and includes a base substrate, and a common electrode layer, a common electrode line mesh, a first metal layer and a second metal layer which are on the base substrate, and the common electrode line mesh and the common electrode layer are electrically connected. The first metal layer includes a first signal line extending along a first direction; the second metal layer includes a second signal line extending along a second direction and a plurality of repair connection portions, and each of the plurality of repair connection portions has a first overlap portion overlapping the first signal line in a direction perpendicular to the base substrate and a second overlap portion overlapping the common electrode line mesh in the direction perpendicular to the base substrate.

For example, the common electrode line mesh includes a first common electrode line extending along the first direction and a second common electrode line extending along the second direction, and the second overlap portion of each of the plurality of repair connection portions overlaps the first common electrode line in the direction perpendicular to the base substrate.

For example, the array substrate includes a display region and a peripheral region surrounding the display region, and the plurality of repair connection portions are distributed in the display region and the peripheral region of the array substrate.

For example, each of the plurality of repair connection portions extends along the second direction, and each of the plurality of repair connection portions and the second signal line are spaced apart along the first direction.

For example, the plurality of repair connection portions are distributed along the first direction at an equal interval.

For example, the first signal line is a gate line or a data line, and the second signal line is the data line or the gate line.

According to the embodiments of the present disclosure, a repair method of the array substrate is provided and used for repairing disconnection of the first signal line in the array substrate described above. The method includes: selecting at least two repair connection portions among the plurality of repair connection portions, in which the at least two repair connection portions are respectively arranged on two sides of a disconnection portion of the first signal line along the first direction; cutting the common electrode line mesh to obtain a first separation portion, in which the second overlap portion of each of the at least two repair connection portions selected overlaps the first separation portion in the direction perpendicular to the base substrate; and electrically connecting each of the at least two repair connection portions selected with the first signal line and the first separation portion.

For example, the array substrate further includes a pixel electrode layer, and the repair method further includes: cutting the pixel electrode layer to obtain a second separation portion that overlaps the first separation portion in the direction perpendicular to the base substrate.

For example, the common electrode line mesh includes a first common electrode line extending along the first direction and a second common electrode line extending along the second direction, and the cutting the common electrode line mesh to obtain the first separation portion includes: cutting the first common electrode line to obtain the first separation portion.

For example, the first signal line is a gate line or a data line, and the second signal line is the data line or the gate line.

For example, the electrically connecting each of the at least two repair connection portions selected with the first signal line and the first separation portion includes: welding each of the at least two repair connection portions selected to the first signal line and the first separation portion.

According to the embodiments of the present disclosure, another array substrate is provided and includes a base substrate, and a common electrode layer, a common electrode line mesh, a first metal layer and a second metal layer which are on the base substrate, and the common electrode line mesh and the common electrode layer are electrically connected. The first metal layer includes a first signal line extending along a first direction, and the first signal line has a disconnection portion; the second metal layer includes a second signal line extending along a second direction and a plurality of repair connection portions, and each of the plurality of repair connection portions has a first overlap portion overlapping the first signal line in a direction perpendicular to the base substrate and a second overlap portion overlapping the common electrode line mesh in the direction perpendicular to the base substrate; the plurality of repair connection portions include at least two selected repair connection portions, the at least two selected repair connection portions are arranged on two sides of the disconnection portion of the first signal line along the first direction, the first overlap portion of each of the at least two selected repair connection portions is electrically connected with the first signal line, the second overlap portion of each of the at least two selected repair connection portions is electrically connected with a first separation portion, the common electrode line mesh includes the first separation portion, and the first separation portion and a portion of the common electrode line mesh other than the first separation portion are disconnected from each other.

For example, the common electrode line mesh includes a first common electrode line extending along the first direction and a second common electrode line extending along the second direction, the first common electrode line includes the first separation portion, and the first separation portion and a portion of the first common electrode line other than the first separation portion are disconnected from each other.

For example, each of the plurality of repair connection portions extends along the second direction, and each of the plurality of repair connection portions and the second signal line are spaced apart from each other in the first direction.

For example, the plurality of repair connection portions are distributed along the first direction at an equal interval.

For example, the first signal line is a gate line or a data line, and the second signal line is the data line or the gate line.

For example, the array substrate further includes a pixel electrode layer, the pixel electrode layer includes a second separation portion, and the second separation portion and a portion of the pixel electrode layer other than the second separation portion are disconnected from each other.

According to the embodiments of the present disclosure, a display panel is provided and includes the array substrate described above.

According to the embodiments of the present disclosure, a display device is provided and includes the display panel described above.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
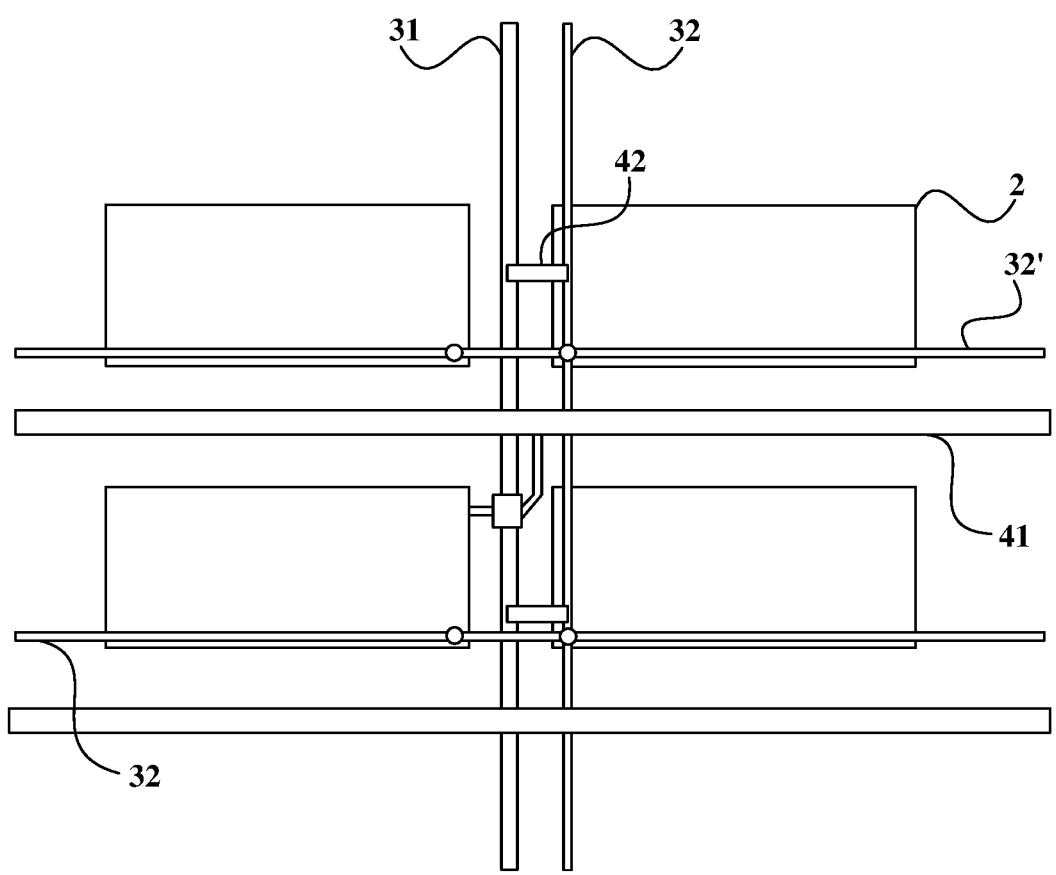
FIG. 1 is a top view of an array substrate according to embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

A main component of a liquid crystal display is a liquid crystal display panel. The liquid crystal display panel includes an array substrate, an opposite substrate opposite to the array substrate, and a liquid crystal layer between the array substrate and the opposite substrate. For example, the array substrate of the liquid crystal display panel mainly includes: a base substrate and a first electrode layer, a first metal layer, a first insulating layer, an active layer, a second metal layer, a second insulating layer and a second electrode layer which are sequentially disposed on the base substrate. For example, the first metal layer includes a gate line, a gate electrode connected with the gate line, and a common electrode line connected with the first electrode layer; the second metal layer includes a data line, a source electrode connected with the data line, and a drain electrode spaced apart from the source electrode; the second electrode layer is connected with the drain electrode of the second metal layer through a via hole in the second insulating layer; and the gate electrode, the active layer, the source electrode and the drain electrode form a thin film transistor.

During a manufacturing process of the array substrate, due to the limitation of conditions of manufacturing process, foreign particles such as dust inevitably adhere to a surface of the first metal layer away from the base substrate, and the foreign particles may pierce the first insulating layer, causing damage of the first insulating layer. In forming the second metal layer, an etching liquid flows into a damaged portion of the first insulating layer and corrodes the first metal layer, thereby causing the gate line to be disconnected.

For example, a repair method may be adopted and include: forming two via holes in the second insulating layer of the array substrate, so that the two via holes are respectively located on two sides of a disconnection portion of the gate line and reach a surface of the gate line on a side of the gate line away from the base substrate; and forming a conductive wire on a surface of the second insulating layer, so that two ends of the conductive wire are respectively located in the two via holes so that the disconnected portions of the gate line are electrically connected each other by the conductive wire.

Because the via holes have a certain depth, the conductive wire easily breaks during extending from the surface of the second insulating layer to an inner wall of the via holes, so that the disconnected portions of the gate line are not electrically connected with each other, resulting in repair failure. In addition, a laser is usually used to form the via holes, the first metal layer is usually formed of a metal having a high reflectance such as copper, and after the laser is reflected by the first metal layer, it is likely that the first insulating layer and the second insulating layer are cracked due to irradiation of the reflected laser.

Embodiments of the present disclosure provide an array substrate, the array substrate includes a base substrate, and a common electrode layer, a common electrode line mesh, a first metal layer and a second metal layer which are on the base substrate, and the common electrode line mesh and the common electrode layer are electrically connected. The first metal layer includes a first signal line extending along a first direction; the second metal layer includes a second signal line extending along a second direction and a plurality of repair connection portions, and each of the plurality of repair connection portions has a first overlap portion overlapping the first signal line in a direction perpendicular to the base substrate and a second overlap portion overlapping the common electrode line mesh in the direction perpendicular to the base substrate.

The embodiments of the present disclosure provide a repair method of the array substrate used for repairing disconnection of the first signal line in the array substrate described above. The method includes: selecting at least two repair connection portions among the plurality of repair connection portions, so that the at least two repair connection portions are respectively arranged on two sides of a disconnection portion of the first signal line along the first direction; cutting the common electrode line mesh to obtain a first separation portion, so that the second overlap portion of each of the at least two repair connection portions selected overlaps the first separation portion in the direction perpendicular to the base substrate; and electrically connecting each of the at least two repair connection portions selected with the first signal line and the first separation portion.

The embodiments of the present disclosure further provide another array substrate, the array substrate includes the base substrate, and the common electrode layer, the common electrode line mesh, the first metal layer and the second metal layer which are on the base substrate, and the common electrode line mesh and the common electrode layer are electrically connected. The first metal layer includes the first signal line extending along the first direction, and the first signal line has the disconnection portion; the second metal layer includes the second signal line extending along the second direction and the plurality of repair connection portions, and each of the plurality of repair connection portions has the first overlap portion overlapping the first signal line in the direction perpendicular to the base substrate and a second overlap portion overlapping the common electrode line mesh in the direction perpendicular to the base substrate; the plurality of repair connection portions include at least two selected repair connection portions, the at least two selected repair connection portions are respectively arranged on two sides of the disconnection portion of the first signal line along the first direction, the first overlap portion of each of the at least two selected repair connection portions is electrically connected with the first signal line, the second overlap portion of each of the at least two selected repair connection portions is electrically connected with the first separation portion, the common electrode line mesh includes the first separation portion, and the first separation portion and a portion of the common electrode line mesh other than the first separation portion are disconnected from each other.

In the array substrate and the repair method according to the embodiments of the present disclosure, the disconnection of the first signal line is reliably repaired, thereby improving the repair success rate of the array substrate.

It should be noted that, according to actual needs, the first metal layer is insulated from any one of the common electrode layer, the common electrode line mesh and the second metal layer, and the second metal layer is insulated from any one of the common electrode layer, the common electrode line mesh and the first metal layer.

It should be noted that the embodiments of the present disclosure do not limit the upper and lower positional relationship of the first metal layer and the second metal layer in the direction perpendicular to the base substrate. For example, in the following, descriptions will be made by taking the case where the first metal layer is below the second metal layer as an example.

It should be noted that the embodiments of the present disclosure do not limit the upper and lower positional relationship of the common electrode layer, the common electrode line mesh, the first metal layer, and the second metal layer in the direction perpendicular to the base substrate, which may be arranged as needed.

It should be noted that the embodiments of the present disclosure do not limit the first signal line and the second signal line. For example, the first signal line is a gate line or a data line, and the second signal line is the data line or the gate line. For example, each of the first signal line and the second signal line is a wire other than the gate line and the data line, such as a power line, a reset line, or the like. For example, in the following, descriptions will be made by taking the case where the first signal line is the gate line and the second signal line is the data line as an example.

Hereinafter, the embodiments of the present disclosure will be described in detail with reference to the accompanying drawings.

Figure 2:
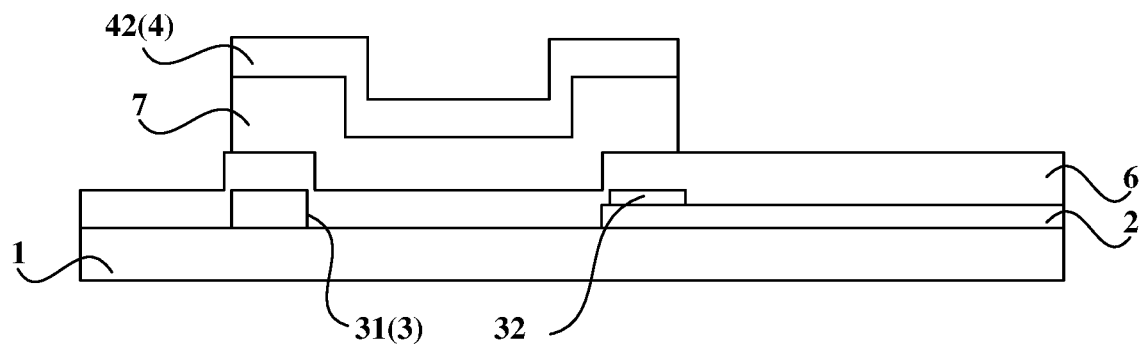
FIG. 2 is a schematic cross-sectional view of the array substrate according to the embodiments of the present disclosure.

As shown in FIG. 1 and FIG. 2, the embodiments of the present disclosure provide the array substrate, the array substrate includes the base substrate 1, and the common electrode layer 2, the common electrode line mesh, the first metal layer 3 and the second metal layer 4 which are on the base substrate 1, and the common electrode line mesh is electrically connected with the common electrode layer 2.

For example, the array substrate further includes a first insulating layer 6, and the first metal layer 3 and the second metal layer 4 are insulated from each other by the first insulating layer 6.

For example, the first metal layer 3 includes the gate line 31 extending along the first direction.

For example, the second metal layer 4 includes the data line 41 extending along the second direction and the plurality of repair connection portions 42, each repair connection portion 42 has the first overlap portion overlapping the gate line 31 in the direction perpendicular to the base substrate 1 and the second overlap portion overlapping the common electrode line mesh in the direction perpendicular to the base substrate 1.

For example, the common electrode line mesh includes a first common electrode line 32 extending along the first direction and a second common electrode line 32' extending along the second direction, and the second overlap portion of each repair connection portion 42 overlaps the first common electrode line 32 in the direction perpendicular to the base substrate 1.

For example, each repair connection portion 42 extends along the second direction, and each repair connection portion 42 and the data line 41 are spaced apart from each other in the first direction.

For example, the plurality of repair connection portions 42 are distributed along the first direction at an equal interval.

For example, the array substrate includes a plurality of the gate lines 31 and a plurality of the data lines 41, the plurality of the gate lines 31 and the plurality of the data lines 41 intersect each other to define a plurality of pixel units, each pixel unit includes a thin film transistor and a pixel electrode layer connected with the thin film transistor. The thin film transistor includes a gate electrode, an active layer, a source electrode and a drain electrode. The gate electrode is connected with the gate line 31 or the gate electrode and the gate line 31 are formed in one-piece manner, the source electrode is connected with the data line 41 or the source electrode and the data line are formed in one-piece manner, and the drain electrode is connected with the pixel electrode layer.

For example, for each gate line 31, a plurality of repair connection portions 42 are provided along the first direction.

For example, both the common electrode layer 2 and the first metal layer 3 are in direct contact with the base substrate 1, and the common electrode layer 2 and the first metal layer 3 are spaced apart from each other.

For example, the common electrode line mesh is formed of the same material as the gate line 31 and formed simultaneously with the gate line 31. That is, the common electrode line mesh and the gate line 31 are simultaneously formed by a same patterning process.

In the array substrate provided by the embodiments of the present disclosure, in a situation where the gate line 31 is disconnected, firstly at least two repair connection portions 42 are selected, and the at least two repair connection portions 42 are arranged respectively on two sides of the disconnection portion of the gate line 31 along an extending direction of the gate line 31; then, the first separation portion 321 is obtained by cutting the common electrode line mesh (for example, by cutting the first common electrode line 32), and the second overlap portion of each repair connection portion 42 selected overlaps the first separation portion 321 in the direction perpendicular to the base substrate 1; finally, each repair connection portion 42 selected is electrically connected with the gate line 31 and the first separation portion 321 by, for example, welding. In this way, portions of the gate line 31 on two sides of the disconnection portion are reliably electrically connected, and the repair success rate of the array substrate is improved.

For example, the first metal layer 3 further includes the gate electrode connected with the gate line 31, and the second metal layer 4 further includes the source electrode connected with the data line 41 and the drain electrode spaced apart from the source electrode.

In the embodiments of the present disclosure, the specific type of the repair connection portion 42 is not limited. For example, the repair connection portion 42 is a linear repair connection portion or a plate-like repair connection portion. The cross-sectional shape of the repair connection portion 42 is not limited. For example, the cross-sectional shape of the repair connection portion 42 is a rectangle, a circle, a triangle or a trapezoid.

For example, the array substrate includes a display region and a peripheral region surrounding the display region; the plurality of pixel units, which are defined by the plurality of the gate lines 31 and the plurality of the data lines 41 intersecting each other, are located in the display region; and the plurality of repair connection portions 42 are distributed in the display region and the peripheral region of the array substrate.

For example, as shown in FIG. 1, each pixel unit includes a display portion and a non-display portion outside the display portion, the common electrode layer 2 is in the display portion, and the gate line 31 and the data line 41 are in the non-display portion. For example, each repair connection portion 42 extends from the display portion of the pixel unit to the non-display portion of the pixel unit.

For example, in the situation where the gate line 31 is disconnected, the repair connection portions 42 closest to the portions of the gate line 31 on two sides of the disconnection portion of the gate line 31 are selected for repair, so that the repair region of the array substrate is small.

Figure 3:
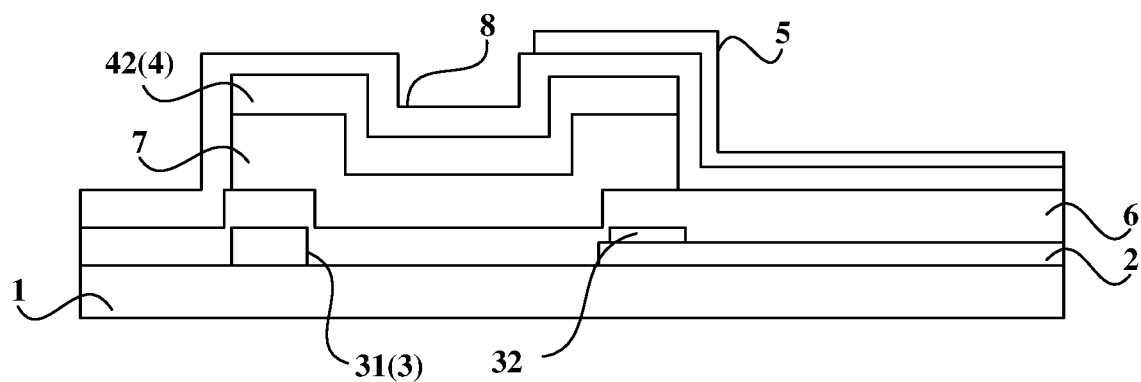
FIG. 3 is another schematic cross-sectional view of the array substrate according to the embodiments of the present disclosure.

For example, the array substrate further includes a second insulating layer 8 and the pixel electrode layer 5 which are sequentially disposed on the second metal layer 4. For example, as shown in FIG. 3, the array substrate includes the base substrate 1, and the common electrode layer 2, the first metal layer 3, the first insulating layer 6, the active layer 7, the second metal layer 4, the second insulating layer 8 and the pixel electrode layer 5 which are sequentially disposed on the base substrate 1. For example, the second insulating layer 8 has a via hole (not shown in FIG. 3), and the pixel electrode layer 5 is connected with the drain electrode included in the second metal layer 4 through the via hole.

The embodiments of the present disclosure further provide a display panel including the array substrate as described above.

In the display panel provided by the embodiments of the present disclosure, in the situation where the gate line 31 in the array substrate of the display panel is disconnected, firstly at least two repair connection portions 42 are selected, and the at least two repair connection portions 42 are arranged respectively on the two sides of the disconnected portion of the gate line 31 along the extending direction of the gate line 31; then, the first separation portion 321 is obtained by cutting the common electrode line mesh (for example, by cutting the first common electrode line 32), and the second overlap portion of each repair connection portion 42 selected overlaps the first separation portion 321 in the direction perpendicular to the base substrate 1; finally, each repair connection portion 42 selected is electrically connected with the gate line 31 and the first separation portion 321 by, for example, welding. In this way, the portions of the gate line 31 respectively on the two sides of the disconnection portion are reliably electrically connected, and the repair success rate of the array substrate is improved.

The embodiments of the present disclosure further provide a display device including the display panel as described above. In the display device provided by the embodiments of the present disclosure, in a situation where the gate line 31 of the array substrate used in the display panel is disconnected, the repair success rate is high.

The embodiments of the present disclosure do not limit a specific type of the display device. For example, the display device may be a liquid crystal television, a liquid crystal display, a digital photo frame, an electronic paper, a mobile phone, or the like.

Figure 4:
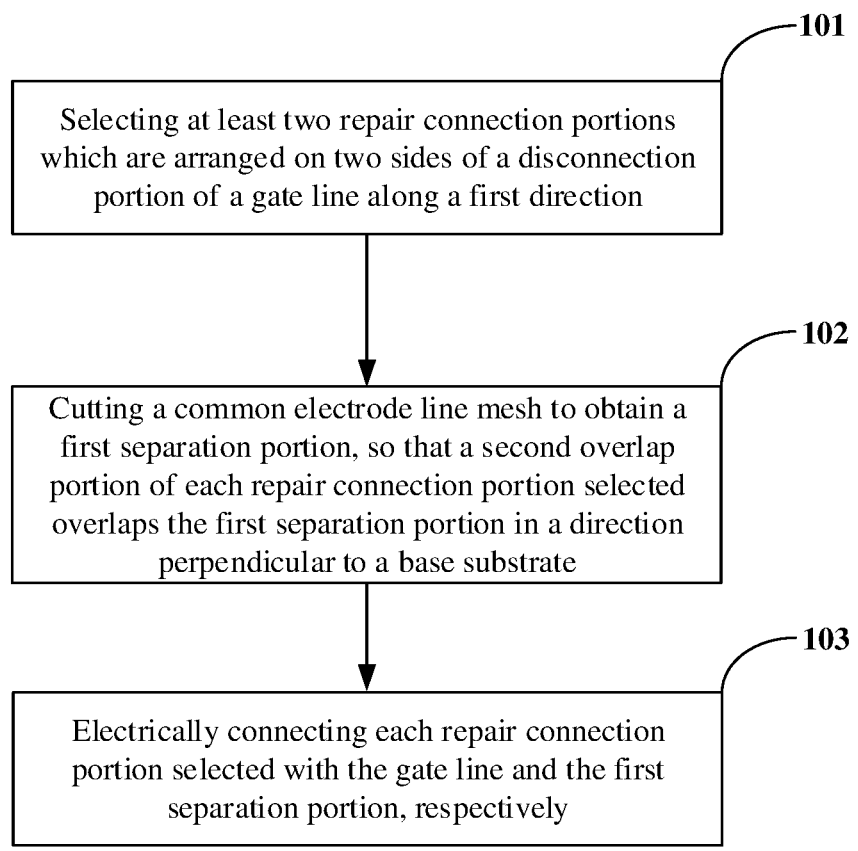
FIG. 4 is a schematic flow chart of a repair method of the array substrate according to the embodiments of the present disclosure.

As shown in FIG. 4, the embodiments of the present disclosure further provide a repair method for repairing the disconnection of the gate line 31 of the array substrate as described in the above embodiments. For example, the method includes the following steps.

Step 101, selecting at least two repair connection portions 42 respectively arranged on the two sides of the disconnection portion of the gate line 31 along the first direction.

Step 102, cutting the common electrode line mesh to obtain the first separation portion 321, so that the second overlap portion of each repair connection portion 42 selected overlaps the first separation portion 321 in the direction perpendicular to the base substrate 1.

Step 103: electrically connecting each repair connection portion 42 selected with the gate line 31 and the first separation portion 321, respectively.

In the repair method provided by the embodiments of the present disclosure, in the situation where the gate line 31 is disconnected, firstly at least two repair connection portions 42 are selected, and the at least two repair connection portions 42 are located respectively on the two sides of the disconnected portion of the gate line 31 along the extending direction of the gate line 31; then, the first separation portion 321 is obtained by cutting the common electrode line mesh (for example, by cutting the first common electrode line 32), and the second overlap portion of each repair connection portion 42 selected overlaps the first separation portion 321 in the direction perpendicular to the base substrate 1; finally, each repair connection portion 42 selected is electrically connected with the gate line 31 and the first separation portion 321 by, for example, welding. In this way, the portions of the gate line 31 on the two sides of the disconnection portion are reliably electrically connected, and the repair success rate of the array substrate is improved.

For example, the array substrate further includes the second insulating layer 8 and the pixel electrode layer 5 which are sequentially disposed on the second metal layer 4, and the above repair method further includes: cutting the pixel electrode layer 5 to obtain a second separation portion 5' that overlaps the first separation portion 321 in the direction perpendicular to the base substrate 1. In this way, an electric field between the first separation portion 321 of the common electrode line 32 and the pixel electrode layer 5 is avoided, thereby improving the display effect of the display panel.

For example, for the purpose of avoiding the electric field between the first separation portion 321 of the common electrode line 32 and the pixel electrode layer 5, it is desirable that the second separation portion 5' has a relatively large area, for example, an orthographic projection of the first separation portion 321 on the base substrate 1 is located within an orthographic projection of the second separation portion 5' on the base substrate 1.

For example, for the purpose of increasing the display region, it is desirable that the second separation portion 5' has a relatively small area, for example, the orthographic projection of the first separation portion 321 on the base substrate 1 coincide with the orthographic projection of the second separation portion 5' on the base substrate 1.

For example, in the step 103, each of the at least two repair connection portions 42 selected is electrically connected with the gate line 31 and the first separation portion 321 by welding, respectively. For example, the welding method is not limited and may be laser welding, electric welding or gas welding.

For example, the common electrode line mesh includes the first common electrode line 32 extending along the first direction and the second common electrode line 32' extending along the second direction, and in the step 102, the first separating unit 321 is obtained by cutting the first common electrode line 32.

For example, the array substrate includes the base substrate 1, and the common electrode layer 2, the first metal layer 3 and the second metal layer 4 which are sequentially disposed on the base substrate 1, and in the situation where the gate line is found to be disconnected after the second metal layer 4 is formed, the repair method includes: selecting the at least two repair connection portions 42 according to the disconnection portion of the gate line 31, so that the at least two repair connection portions 42 are respectively arranged on two sides of the disconnection portion of the gate line 31 along the extending direction of the gate line 31; cutting the common electrode line mesh to obtain the first separation portion 321, so that the second overlap portion of each of the repair connection portions 42 selected overlaps the first separation portion 321 in the direction perpendicular to the base substrate 1; and welding each of the repair connection portions 42 selected to the gate line 31 and the first separation portion 321, respectively. The array substrate after repair is shown in FIG. 5.

For example, the array substrate further includes the second insulating layer 8 and the pixel electrode layer 5 which are sequentially disposed on the second metal layer 4, in the situation where the gate line 31 is found to be disconnected after the pixel electrode layer 5 is formed, the repair method includes: selecting the at least two repair connection portions 42 according to the disconnection portion of the gate line 31, so that the at least two repair connection portions 42 are respectively arranged on two sides of the disconnection portion of the gate line 31 along the extending direction of the gate line 31; cutting the common electrode line mesh to obtain the first separation portion 321, so that the second overlap portion of each of the repair connection portions 42 selected overlaps the first separation portion 321 in the direction perpendicular to the base substrate 1; and welding each of the repair connection portions 42 selected to the gate line 31 and the first separation portion 321, respectively; cutting the second pixel electrode layer 5 to obtain the second separation portion 5' that overlaps the first separation portion 321 in the direction perpendicular to the base substrate 1. The array substrate after repair is shown in FIG. 6.

Figure 5:
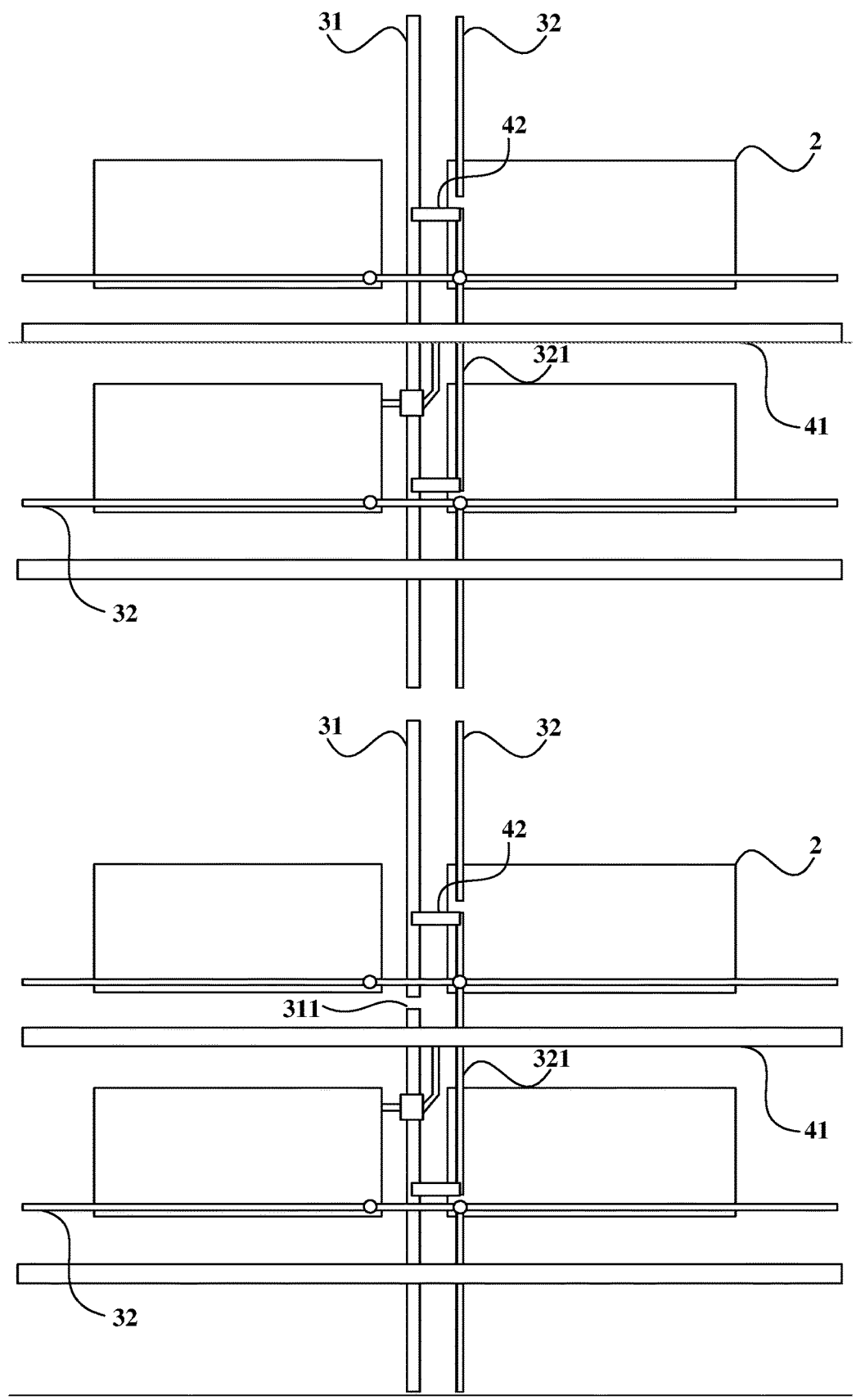
FIG. 5 is another top view of the array substrate according to the embodiments of the present disclosure.
Figure 6:
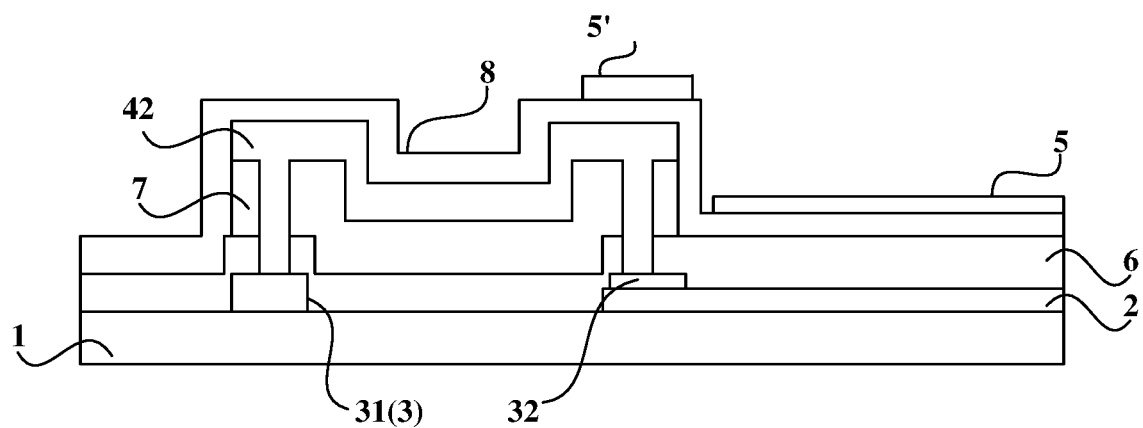
FIG. 6 is still another schematic cross-sectional view of the array substrate according to the embodiments of the present disclosure.

As shown in FIG. 5 and FIG. 6, the embodiments of the present disclosure further provide the array substrate including the base substrate 1, and the common electrode layer 2, the common electrode line mesh, the first metal layer 3 and the second metal layer 4 which are disposed on the base substrate 1, and the common electrode line mesh is electrically connected with the common electrode layer 2.

For example, the array substrate further includes the first insulating layer 6, and the first metal layer 3 and the second metal layer 4 are insulated from each other by the first insulating layer 6.

For example, the first metal layer 3 includes the gate line 31 extending along the first direction, and the gate line has the disconnection portion 311.

For example, the second metal layer 4 includes the second signal line 41 extending along the second direction and the plurality of repair connection portions 42, and each repair connection portion 42 has the first overlap portion overlapping the gate line 31 in the direction perpendicular to the base substrate 1 and the second overlap portion overlapping the common electrode line mesh in the direction perpendicular to the base substrate 1.

For example, the plurality of repair connection portions 42 include at least two selected repair connection portions 42 that are respectively arranged on the two sides of the disconnection portion 311 of the gate line 31 along the first direction, the first overlap portion of each selected repair connection portion 42 is electrically connected with the gate line 31, and the second overlap portion of each selected repair connection portion 42 is electrically connected with the first separation portion 321, the common electrode line mesh includes the first separation portion 321, and the first separation portion 321 and the portion of the common electrode line mesh other than the first separation portion 321 are disconnected from each other.

For example, the common electrode line mesh includes the first common electrode line 32 extending along the first direction and the second common electrode line 32' extending along the second direction, the first common electrode line 32 includes the first separation portion 321, and the first separation portion 321 and the portion of the first common electrode line 32 other than the first separation portion 321 are disconnected from each other.

For example, the array substrate further includes the pixel electrode layer 5 including the second separation portion 5', and the second separation portion 5' and a portion of the pixel electrode layer 5 other than the second separation portion 5' are disconnected from each other.

For example, the above array substrate is the array substrate which has been repaired by using the repair method described in the foregoing embodiments.

What are described above is related to the illustrative embodiments of the disclosure only and not limitative to the scope of the disclosure; the scopes of the disclosure are defined by the accompanying claims.

What is claimed is:

1. An array substrate, comprising a base substrate, and a common electrode layer, a common electrode line mesh, a first metal layer, and a second metal layer which are on the base substrate, wherein
the common electrode line mesh and the common electrode layer are electrically connected,
the first metal layer comprises a first signal line extending along a first direction,
the second metal layer comprises a second signal line extending along a second direction and a plurality of repair connection portions, and each of the plurality of repair connection portions has a first overlap portion overlapping the first signal line in a direction perpendicular to the base substrate and a second overlap portion overlapping the common electrode line mesh in the direction perpendicular to the base substrate, and
the array substrate further comprises a pixel electrode layer, wherein the pixel electrode layer comprises a portion that overlaps a portion of the common electrode line mesh in the direction perpendicular to the base substrate, and the portion of the common electrode line mesh is between at least two repair connection portions among the plurality of repair connection portions along the first direction.

2. A display panel, comprising the array substrate according to claim 1.

3. A display device, comprising the display panel according to claim 2.

4. The array substrate according to claim 1, wherein the common electrode line mesh comprises a first common electrode line extending along the first direction and a second common electrode line extending along the second direction, the second overlap portion of each of the plurality of repair connection portions overlaps the first common electrode line in the direction perpendicular to the base substrate, and the portion of the pixel electrode layer overlaps a portion of the first common electrode line in the direction perpendicular to the base substrate, and the portion of the first common electrode line is between the at least two repair connection portions among the plurality of repair connection portions along the first direction.

5. The array substrate according to claim 1, comprising a display region, and a peripheral region surrounding the display region, wherein the plurality of repair connection portions are distributed in the display region and the peripheral region.

6. The array substrate according to claim 1, wherein each of the plurality of repair connection portions extends along the second direction, and each of the plurality of repair connection portions and the second signal line are spaced apart from each other in the first direction.

7. The array substrate according to claim 1, wherein the plurality of repair connection portions are distributed along the first direction at an equal interval.

8. The array substrate according to claim 1, wherein the first signal line is a gate line or a data line, and the second signal line is the data line or the gate line.

9. A repair method of an array substrate for repairing disconnection of a first signal line in the array substrate, wherein
the array substrate comprises a base substrate, and a common electrode layer, a common electrode line mesh, a first metal layer, and a second metal layer which are on the base substrate, the common electrode line mesh and the common electrode layer are electrically connected, the first metal layer comprises the first signal line extending along a first direction, the second metal layer comprises a second signal line extending along a second direction and a plurality of repair connection portions, and each of the plurality of repair connection portions has a first overlap portion overlapping the first signal line in a direction perpendicular to the base substrate and a second overlap portion overlapping the common electrode line mesh in the direction perpendicular to the base substrate,
the repair method comprises:
selecting at least two repair connection portions among the plurality of repair connection portions, wherein the at least two repair connection portions are respectively arranged on two sides of a disconnection portion of the first signal line along the first direction;
cutting the common electrode line mesh to obtain a first separation portion, wherein the second overlap portion of each of the at least two repair connection portions selected overlaps the first separation portion in the direction perpendicular to the base substrate, and the first separation portion and a portion of the common electrode line mesh other than the first separation portion are disconnected from each other; and
electrically connecting each of the at least two repair connection portions selected with the first signal line and the first separation portion, wherein
the array substrate further comprises a pixel electrode layer, and the repair method further comprises: cutting the pixel electrode layer to obtain a second separation portion that overlaps the first separation portion in the direction perpendicular to the base substrate.

10. The repair method according to claim 9, wherein the common electrode line mesh comprises a first common electrode line extending along the first direction and a second common electrode line extending along the second direction, and
the cutting the common electrode line mesh to obtain the first separation portion comprises: cutting the first common electrode line to obtain the first separation portion, wherein the first separation portion and a portion of the first common electrode line other than the first separation portion are disconnected from each other.

11. The repair method according to claim 9, wherein the first signal line is a gate line or a data line, and the second signal line is the data line or the gate line.

12. The repair method according to claim 9, wherein the electrically connecting each of the at least two repair connection portions selected with the first signal line and the first separation portion comprises: welding each of the at least two repair connection portions selected to the first signal line and the first separation portion.

13. The repair method according to claim 9, wherein an orthographic projection of the first separation portion on the base substrate coincides with an orthographic projection of the second separation portion on the base substrate.

14. The repair method according to claim 9, wherein the second separation portion and a portion of the pixel electrode layer other than the second separation portion are disconnected from each other.

15. An array substrate, comprising a base substrate, and a common electrode layer, a common electrode line mesh, a first metal layer, and a second metal layer which are on the base substrate, wherein
the common electrode line mesh and the common electrode layer are electrically connected, the first metal layer comprises a first signal line extending along a first direction, and the first signal line has a disconnection portion, the second metal layer comprises a second signal line extending along a second direction and a plurality of repair connection portions, and each of the plurality of repair connection portions has a first overlap portion overlapping the first signal line in a direction perpendicular to the base substrate and a second overlap portion overlapping the common electrode line mesh in the direction perpendicular to the base substrate, the plurality of repair connection portions comprise at least two selected repair connection portions, the at least two selected repair connection portions are arranged on two sides of the disconnection portion of the first signal line along the first direction, the first overlap portion of each of the at least two selected repair connection portions is electrically connected with the first signal line, the second overlap portion of each of the at least two selected repair connection portions is electrically connected with a first separation portion, the common electrode line mesh comprises the first separation portion, and the first separation portion and a portion of the common electrode line mesh other than the first separation portion are disconnected from each other, the array substrate further comprises a pixel electrode layer, and the pixel electrode layer comprises a second separation portion that overlaps the first separation portion in the direction perpendicular to the base substrate.

16. The array substrate according to claim 15, wherein the common electrode line mesh comprises a first common electrode line extending along the first direction and a second common electrode line extending along the second direction, wherein the first common electrode line comprises the first separation portion, and the first separation portion and a portion of the first common electrode line other than the first separation portion are disconnected from each other.

17. The array substrate according to claim 15, wherein each of the plurality of repair connection portions extends along the second direction, and each of the plurality of repair connection portions and the second signal line are spaced apart along the first direction.

18. The array substrate according to claim 15, wherein the plurality of repair connection portions are distributed along the first direction at an equal interval.

19. The array substrate according to claim 15, wherein the first signal line is a gate line or a data line, and the second signal line is the data line or the gate line.

20. The array substrate according to claim 15, the second separation portion and a portion of the pixel electrode layer other than the second separation portion are disconnected from each other.

* * * * *